United States Patent
Wasniewski et al.

(10) Patent No.: US 10,123,466 B2
(45) Date of Patent: Nov. 6, 2018

(54) ELECTRICALLY AND THERMALLY CONDUCTIVE PLANAR INTERFACE GASKET WITH DEFORMABLE FINGERS

(71) Applicant: Raytheon Company, Waltham, MA (US)

(72) Inventors: Joseph R. Wasniewski, Needham, MA (US); David R. Kralj, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/475,742

(22) Filed: Mar. 31, 2017

(65) Prior Publication Data
US 2018/0288909 A1     Oct. 4, 2018

(51) Int. Cl.
H05K 9/00     (2006.01)

(52) U.S. Cl.
CPC ......... *H05K 9/0009* (2013.01); *H05K 9/0015* (2013.01); *H05K 9/0037* (2013.01)

(58) Field of Classification Search
CPC .......................... H05K 9/0015; H05K 9/0037
See application file for complete search history.

(56) References Cited

U.S. PATENT DOCUMENTS

| | | | |
|---|---|---|---|
| 5,070,216 A * | 12/1991 | Thornton | ............. H05K 9/0015 174/355 |
| 5,953,206 A | 9/1999 | Jondrow | |
| 6,049,469 A | 4/2000 | Hood, III et al. | |
| 7,317,618 B2 | 1/2008 | Robinson et al. | |
| 8,599,559 B1 * | 12/2013 | Morrison | ............. H05K 9/0058 361/702 |
| 2004/0150554 A1 | 8/2004 | Stenger et al. | |
| 2009/0207579 A1 | 8/2009 | Boetto et al. | |
| 2009/0290319 A1 * | 11/2009 | Myers | ................. H05K 9/0032 361/818 |
| 2013/0176186 A1 | 7/2013 | Yaccarino et al. | |
| 2013/0323963 A1 | 12/2013 | Morrison et al. | |
| 2015/0288063 A1 | 10/2015 | Johnson et al. | |

FOREIGN PATENT DOCUMENTS

| | | |
|---|---|---|
| EP | 1 214 870 | 3/2001 |
| EP | 1 231 827 A1 | 8/2002 |
| WO | 2001/022788 A1 | 3/2001 |

OTHER PUBLICATIONS

International Search Report and Written Opinion for corresponding International Application No. PCT/US2018/024312 dated Jul. 6, 2018.

* cited by examiner

*Primary Examiner* — Hung V Ngo
(74) *Attorney, Agent, or Firm* — Renner, Otto, Boisselle & Sklar, LLP

(57) ABSTRACT

An electrically- and thermally-conductive gasket includes a planar base and a series of fingers bent out of the plane of the base. The base and the fingers are flexible, allowing the base and the fingers to engage respective matching surfaces on opposite sides of the gasket. The base and the fingers may be parts of a single piece of material, such as a thin metal sheet. The fingers make contact with a surface on one side of the gasket. The fingers may deform separately, allowing good contact to be made even when there is unevenness (non-uniformity) in the surface that they make contact with, or to compensate for the non-uniformity such as non-flatness. Similarly, the base may deform to make good contact with the surface on the side of the gasket opposite the fingers.

16 Claims, 2 Drawing Sheets

ELECTRICALLY AND THERMALLY CONDUCTIVE PLANAR INTERFACE GASKET WITH DEFORMABLE FINGERS

FIELD OF THE INVENTION

The invention pertains to electronic and microwave/radio frequency assemblies in which electrical connection/shielding and thermal management between components of the assembly is of particular importance.

DESCRIPTION OF THE RELATED ART

There is a need for an interface layer that can provide both electrical continuity and low thermal resistance between mating components within electronic and microwave/radio frequency (RF) assemblies, while also managing potential planar motion between those components. No optimal solution exists providing electrical contact and/or RF isolation while achieving a low thermal resistance interface between materials with large surface areas having different coefficients of thermal expansion (CTEs). For example, some conductive adhesives achieve a bonded interface with low thermal resistance, but the adhesive is typically applied thin (to achieve a lower thermal resistance) and possesses a high modulus of elasticity and high glass transition temperature. The use of such adhesives for bonding large surface areas of materials with relatively large differences in Coefficient of Thermal Expansion (CTE) is therefore very limited, especially when these CTE-mismatched materials are to be subjected to relatively large temperature ranges. As an example, a high performance thermal and electrical interface layer is required between RF feed circuitry (wherein the circuitry is mainly dielectric with metal signal layers/plating) and cavity radiators such as stacked antenna patches (wherein the cavity material is aluminum), such that the interface provides robust electromagnetic shielding between neighboring cavities while also managing heat dissipation generated by nominal electrical loss through the RF path.

There are some different options and approaches that have been used in the past, none of which are ideal or suitable for every situation, especially for high-performance electromechanical assemblies which must survive wide temperature ranges and/or external environmental exposure. As mentioned above, high-conductivity liquid or film adhesives do not exhibit enough stress-strain compliance to accommodate CTE-mismatched materials over large bonded areas. Conductive, compressible elastomeric gaskets possess limited electrical and thermal conductivity and are offered in thicker formats than is desirable. There are also non-curing conductive paste/gel products not appropriate for electronic and RF applications, with risks of oozing, pump-out, etc. When conductive adhesives are selected for use, painstaking development and validation is often required in order to reduce risk of disbonding when subjected to the assembly's expected temperature cycles.

SUMMARY OF THE INVENTION

An electrically- and thermally-conductive gasket has a planar, flexible base or sheet, and fingers extending out of the base.

An electrically- and thermally-conductive gasket has a planar, flexible base or sheet, and fingers bent out of the base.

An electrically- and thermally-conductive gasket has a planar, flexible base or sheet, and fingers extending out of the base around the periphery of openings in the base.

According to an aspect of the invention, An electrically- and thermally-conductive interface gasket includes: a planar electrically-conductive flexible base; and a multitude of electrically-conductive fingers emerging out of the base. The base and fingers are configured to make contact with and conform to surfaces of respective objects on opposite respective sides of the gasket. The base and the fingers are configured to deform to conform to the surfaces of the objects.

According to another aspect of the invention, A method of making electrical and thermal connection between surfaces of objects, the method including: placing an electrically- and thermally-conductive gasket between the objects, with a base of the gasket against one of the objects, and fingers of the gasket extending out of the base toward the other of the objects; and pressing together the objects. The pressing deforms the base and/or the fingers, to conform the gasket to the surfaces of the objects and thus render the gasket substantially flat and providing electrical contact while also minimizing air gaps to provide low thermal resistance through the thickness of the gasket.

According to an embodiment of any paragraph(s) of this summary, the base has a series of openings therein.

According to an embodiment of any paragraph(s) of this summary, the fingers are located on peripheries of the openings.

According to an embodiment of any paragraph(s) of this summary, the base and the fingers are parts of a single piece of continuous unitary material.

According to an embodiment of any paragraph(s) of this summary, the material is a sheet metal.

According to an embodiment of any paragraph(s) of this summary, the sheet metal is coated, treated, or plated with another metal.

According to an embodiment of any paragraph(s) of this summary, the sheet metal is plated with a soft metal material that is softer than the sheet metal material that the soft metal covers.

According to an embodiment of any paragraph(s) of this summary, the soft metal material includes a material selected from the group consisting of a tin-lead alloy, tin, silver, and gold.

According to an embodiment of any paragraph(s) of this summary, the base has a thickness of 0.0254 to 0.254 mm (0.001 to 0.010 inches).

According to an embodiment of any paragraph(s) of this summary, the fingers include at least 100 fingers.

According to an embodiment of any paragraph(s) of this summary, the fingers include at least 1000 fingers.

According to an embodiment of any paragraph(s) of this summary, separation between adjacent of the fingers is one-third or less of a width of individual of the fingers.

According to an embodiment of any paragraph(s) of this summary, the openings are rectangular or circular.

According to an embodiment of any paragraph(s) of this summary, the base has a length and width at least 20 cm.

According to an embodiment of any paragraph(s) of this summary, the gasket is in combination with the objects.

According to an embodiment of any paragraph(s) of this summary, the objects include cavities for radiative transmission of electromagnetic energy through openings in the base.

According to an embodiment of any paragraph(s) of this summary, at least one of the objects includes a printed wiring.

According to an embodiment of any paragraph(s) of this summary, the pressing provides an electrical connection between the objects, around the peripheries of the openings.

According to an embodiment of any paragraph(s) of this summary, the objects include cavities for radiative transmission of electromagnetic energy through openings in the base; and the pressing aids in preventing leakage of the electrical energy.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

An electrically and thermally conductive gasket includes a planar base and a series of fingers bent out of the plane of the base. The base and the fingers are flexible, allowing the base and the fingers to engage respective surfaces (for example, planar surfaces) on opposite sides of the gasket. The base and the fingers may be parts of a single piece of material, such as a thin metal sheet. The fingers make contact with a surface on one side of the gasket. The fingers may deform separately, allowing good contact to be made even when there is local unevenness (non-flatness) in the surface that they make contact with, or to compensate for misalignment (non-parallelism) of these surfaces. Similarly, the base may deform to compensate for surface conditions on one or more of the parts. The force from the deformation of the fingers is sufficient to make good electrical and mechanical contact between the gasket and the respective surfaces on opposite sides of the gasket, with the fingers and/or the base deforming as needed. The gasket deforms to a generally flat state, thus minimizing air gaps between the gasket and the two surfaces it interface, and as a result, also minimizing the thermal resistance through gasket interface (i.e., the thermal path is mostly through the thickness of the conductive gasket in direct contact with its mating surfaces on both sides). The gasket may have openings in it, with the fingers surrounding the openings. There may be a large number of fingers, for example thousands, which may aid in making good contact between the gasket and adjacent surfaces. Additionally, the flexible nature of the gasket base and fingers allow it to be used in applications where the surfaces it interfaces are curved/shaped and/or applications in which the surfaces it interfaces are intended to be flexible.

Figure 1:
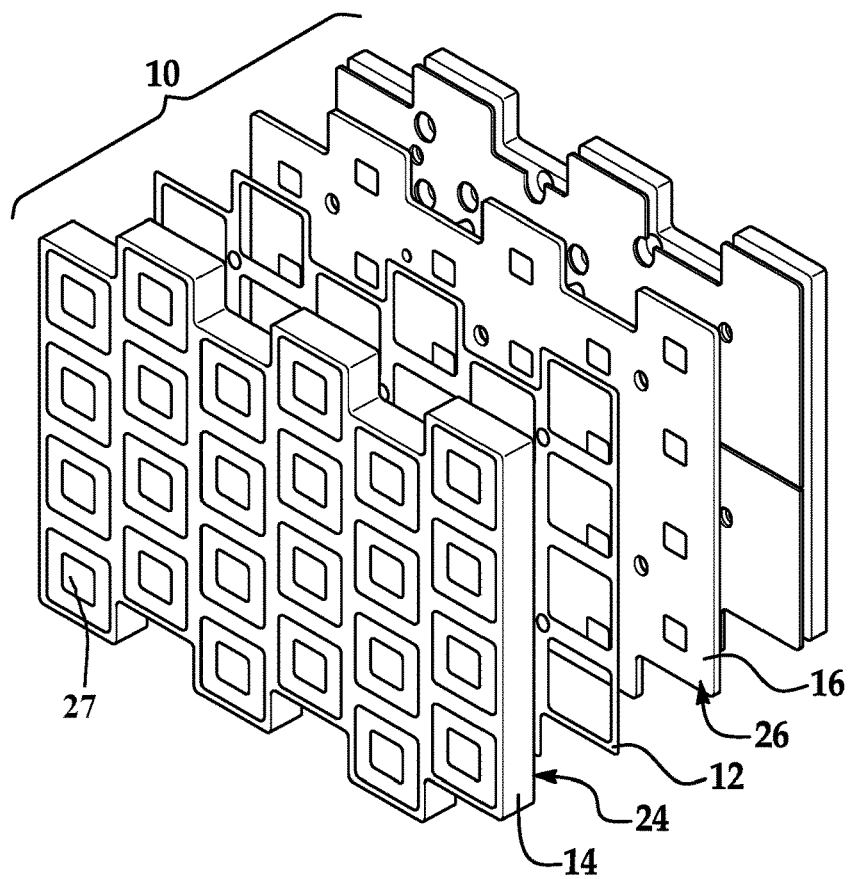
FIG. 1 is an exploded view of a structure that includes a conductive gasket, in accordance with an embodiment of the invention.

FIG. 1 shows a structure 10 in exploded view, with a gasket 12 between a pair of objects 14 and 16 that have respective planar surfaces 24 and 26 that engage opposite respective sides of the gasket 12. The gasket 12 may be one of a series of gaskets. The objects 14 and 16 may be any of a variety of objects that are to be coupled together (electrically, mechanically, and/or thermally) by the gasket 12. In one embodiment the object 14 is a metal housing and object 16 is a printed wiring board (PWB), both parts of an assembly in which radio frequency (RF) energy is transmitted and received. In such a structure RF energy may radiate through a series of antenna element cavities, such as cavities 27 in the object 14, with it being desirable to surround each of the cavities with electrically-conductive material, so as to provide electrical continuity to the cavity wall, electrically isolate cavities from one another, and prevent leakage of RF energy (RF signal loss).

Figure 2:
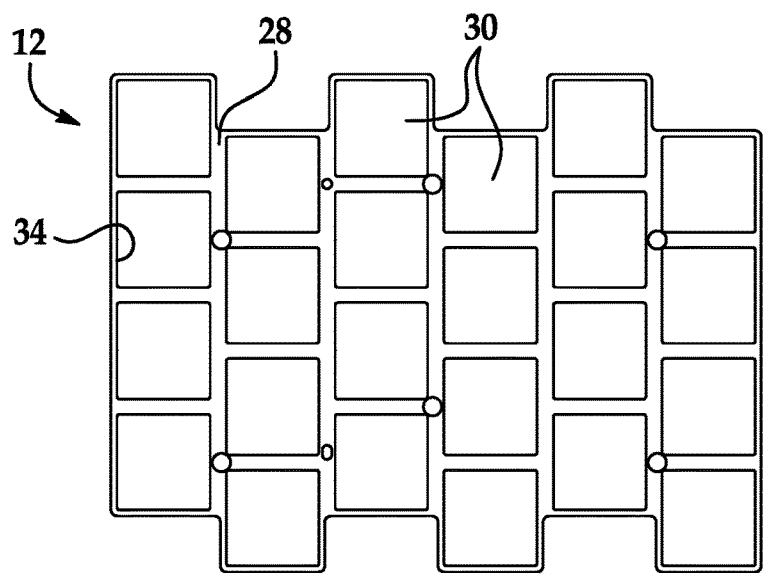
FIG. 2 is a plan view showing part of the gasket of FIG. 2.

FIG. 2 shows the gasket 12 as a planar base or sheet or web 28 surrounding or having therein a series of cavities or openings 30. The openings 30 may be rectangular or circular in shape, or alternatively may have other shapes. There may be multiple of the openings 30 in the gasket, with many different numbers and configurations of the openings 30 being possible.

Figure 3:
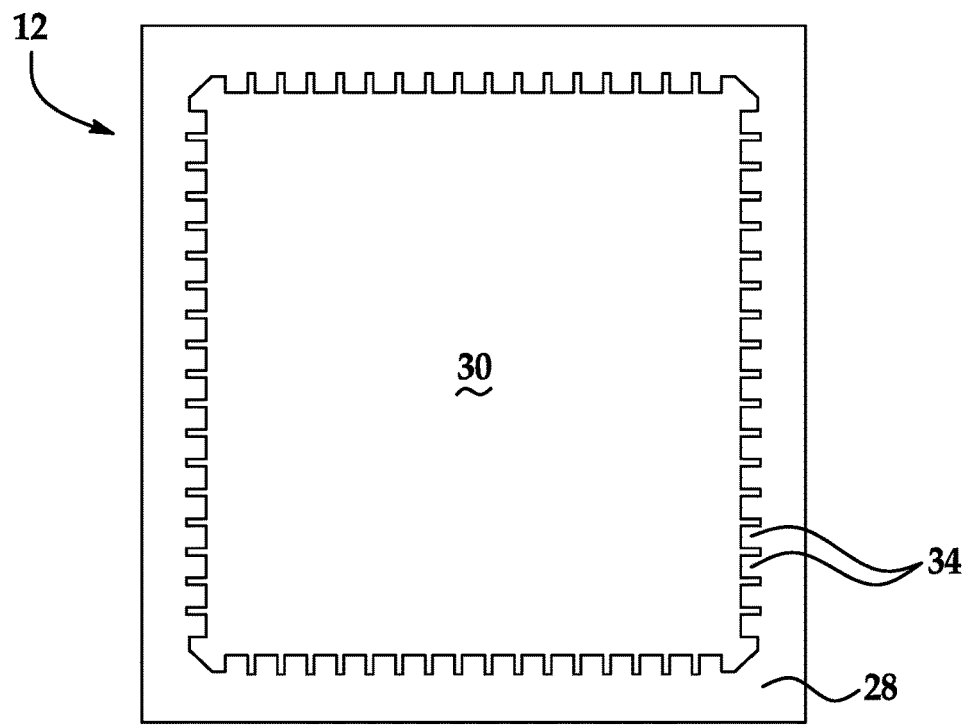
FIG. 3 is a plan view showing detail of a portion of the gasket part of FIG. 2.

With reference now in addition to FIG. 3, each of the cavity openings is surrounded by a series of fingers 34 that extend out from the plane of the sheet or web 28. The fingers 34 may be located along the perimeters of or the peripheries of the cavity openings 30. The fingers 34 may be formed by cutting or etching the material of the gasket 12, with such cutting or etching possibly also used to form the cavity openings 30. Alternatively, the fingers 34 may be formed separately from the formation of the cavity openings 30.

The fingers 34 may be bent to extend out of the plane of the sheet 28. For example the fingers 34 may be bent using a suitably-shaped die with sloped protrusions at locations corresponding to the cavity openings 30.

The planar sheet 28 may be made of electrically- and thermally-conductive material, such as a suitable electrically- and thermally-conductive metal. Examples of suitable materials include beryllium-copper alloys, copper, copper alloys, indium, aluminum, and stainless steel. The gasket 12 may be plated, for example with a soft cold-flowable material such as a tin, tin-lead alloy, silver, or gold, to improve contact and perhaps reduce small gaps between adjacent of the fingers 34. The sheet metal plating (or other surface treatment may provide improved galvanic compatibility between the surfaces interfacing to each side of the gasket 12. In some embodiments the gasket 12 is unplated.

The sheet 28 may be configured to deform under pressure, so as to compensate for overall imperfections in the surfaces 24 or 26 that it engages. Examples of imperfections include non-planarity of the surfaces or roughness/out-of-profile of matching curved/shaped surfaces. The deformation of the sheet (base) 28 and/or the fingers 34 may also compensate for local, smaller-scale non-parallelism or non-flatness, of the surfaces 24 and 26. Under pressure the sheet 28 and the fingers 34 deform (for example by resiliently bending, much like spring action) to maintain good contact with the surfaces 24 and 26. Furthermore, the sheet 28 and fingers 34 may bend and flex as surfaces 24 and 26 bend/flex while maintaining contact between these two surfaces. The sheet 28 may have a thickness of about 0.0762 mm (0.003 inches), although many other thicknesses are possible as the design requires to achieve the desired mechanical properties (for example, stiffness of the fingers). For example, the thickness may be in the range of 0.0254 to 0.254 mm (0.001 to 0.010 inches).

The fingers 34 each may have a length of 1 mm (0.040 inches), a width of 1.6 mm (0.62 inches), a pitch of 2.1 mm (0.082 inches), and may be bent at an angle of about 35 degrees out of the plane of the base or sheet 28, although a wide range of other values are possible as desired to optimize mechanical properties (e.g., flexibility of both the base and the fingers), thermal characteristics (e.g., thermal resistance), and electromagnetic properties (e.g., shielding/isolating a desired RF wavelength). The spacing between adjacent of the fingers 34 may be less than or equal to about one-third of the width of a finger. The fingers 34 should have a length, width, and angle that allows the fingers 34 to be deflected by applying a suitable pressing force on the gasket 12. The fingers 34 may have any of a variety of suitable shapes, for example being curved and/or having multiple bends.

There may be a large number of the fingers 34 surrounding each of the cavities 30. For instance there may be dozens or hundreds of the fingers surrounding each of the cavities or openings 30, for example with 60 or 70 fingers surrounding a single cavity. The gasket 12 may have a total of at least 100, or at least 1000, of the fingers 34. A larger number of smaller fingers 34 per unit area allows for the gasket 12 to better conform to the surfaces 24 and 26, making a better contact with the objects 14 and 16. Thus the combination of the fingers 34 and the flexibility of the thin sheet 28 allows the gasket 12 to fill gaps and uneven portions in the surfaces 24 and/or 26.

Figure 4:
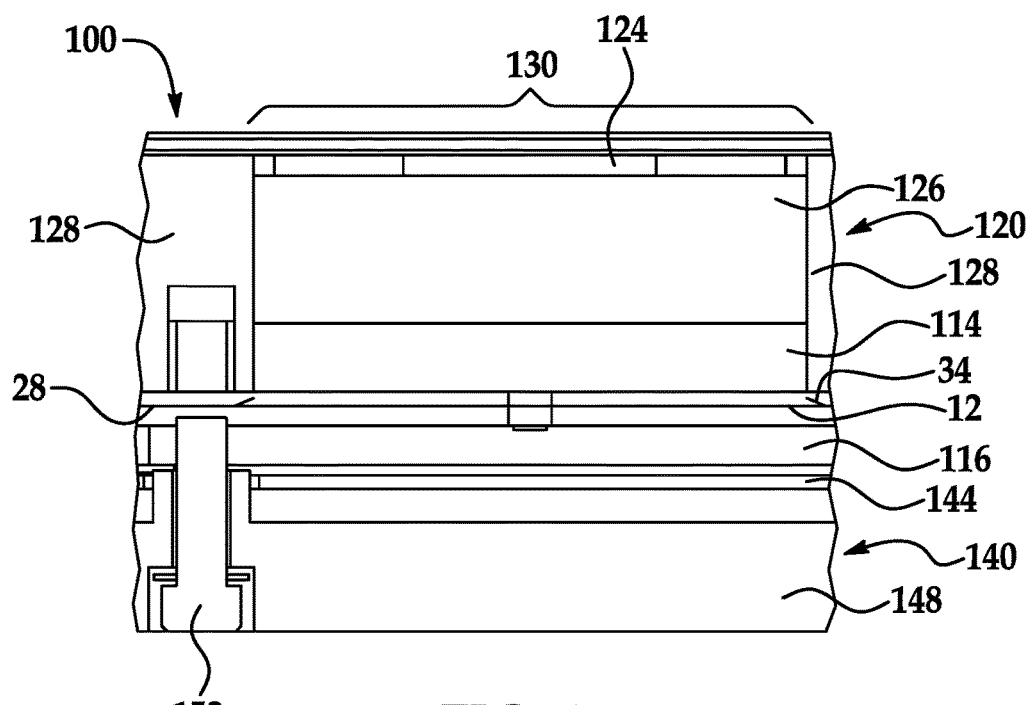
FIG. 4 is a side sectional view showing part of an antenna assembly that includes a conductive gasket, in accordance with an embodiment of the invention.

FIG. 4 shows the gasket 12 as part of a radio frequency (RF) antenna assembly 100, comprising an RF/microwave circuit card assembly (CCA) and one or more RF radiating elements/antennae—in this case a patch antenna. The gasket 12 is between a printed wiring board (PWB) 116 (part of an RF circuit card assembly) and a housing 128, all part of the antenna assembly 100 through which electromagnetic energy is radiated. The housing 128 defines parts of a series of cavities 130, and the gasket 12 has openings corresponding to these cavities such that the materials within the cavities are allowed to be in contact with the RF PWB 116. Only one such cavity 130 is shown in FIG. 4, with an opening in the gasket 12 for said cavity, with some of the fingers 34 of the gasket 12 around the perimeter of the opening for the cavity 130. A lower patch antenna structure 114 of an upper part 120 of the antenna assembly 100 contacts the RF PWB 116 through the cavity and gasket opening. The upper part 120 also includes an upper patch antenna 124, a spacer 126 between the lower patch antenna 114 and the upper patch antenna 124, and a housing 128.

A bottom part 140 of the assembly 100 includes the PWB 116, which may be an RF PWB containing circuitry for multiple RF feeds, each feed corresponding to an RF stacked patch antenna element as described above. A compressible pad 144 is pressed against the PWB 116 by a bottom housing part 148, which in turn applies pressure to compress the gasket 12. The pad 144 may be made of any of a variety of suitable materials, for example silicone. Any number of fasteners 152 may be used to couple the housing part 148 to the housing 128. Alternatively, fasteners may be used to directly couple the PWB to the housing. The housing parts 128 and 148 may be made of any suitable material, for example aluminum.

A feed may be located in the PWB 116, which receives a signal from a transmit/receive module (not shown), through an interconnection. The signal is routed inside the PWB 116 to a feed trace, which radiates through a slotted opening in the metallized layer at the top of the PWB 116. This signal then passes into an antenna element, such as a stacked patch antenna element including the patch antenna structures 114 and 124 separated by spacer 126. The PWB 116 is electromagnetically coupled to each of the cavities 130 of housing 128. The gasket 12 facilitates this coupling by making a robust electrical contact between a top surface of the PWB 116, which may be a copper surface (which may be further over-plated) functioning as a "ground plane," and a bottom surface of the housing 128, which may be made of aluminum and which may be plated or chemically treated. This allows the cavity 130 to function as a coaxial waveguide for the antenna element 124. The fingers 34 contain the RF energy in the cavity, and keep the RF energy from leaking out, scattering, or causing arcing between the PWB 116 and the housing 128, which would be undesirable in that it could result in signal energy loss and/or mismatch/reflection. Additionally, as heat is dissipated by components in the upper structure 120 or by the PWB (for example, by typical RF energy loss), the gasket 12 provides a heat conduction path from the housing 128 (and thereby entire upper structure 120) to the PWB 116, or vice versa depending on the where the heat sink is located, that has a relatively low thermal resistance, i.e. there is a low temperature difference across the gasket interface.

The antenna assembly 100 shown may be part of a larger array of antenna assemblies. The antenna assembly 100 may have any suitable number of the cavities 130. The cavities 130 may each be rectangular in cross section, and may be in a rectangular array, although other configurations are possible.

Any number of antenna assemblies 100 maybe used to form an antenna array of larger size. The gasket 12 may cover similar areas. More broadly the gasket 12 may have a length and a width both of at least 20 cm. It will be appreciated that these are only example areas, and that a wide variety of other sizes for the gasket 12 are possible.

Many other uses are possible for planar electrically- and thermally-conductive gaskets such as the gasket 12. For example such a gasket may be used on a receiver/exciter RF module. Fingers of the gasket may be used to create an electromagnetic interference (EMI) shield and/or electrical ground interface between a PWB or CCA and a housing/chassis in which this component resides. This EMI/ground interface may be located at the perimeter wall of the chassis as well as at internal walls dividing the enclosed interior space into isolations bays or cavities for different circuitry. The planar base of such a gasket may provide a thermal path or thermal interface to allow heat to pass from the PWB/CCA to the cooled chassis with lower thermal resistance than other alternative materials and methods would allow.

In certain applications, the electrically- and thermally-conductive gasket provides an interface between components/surfaces which are intended to be flexible. For example, the components on either side of the gasket may be manufactured from flexible plastic/polymer-based materials with conductive surface traces, coatings, treatments, etc. that are electrically and/or thermally tied together by the gasket. The flexible nature of the gasket with fingers permits such an assembly to remain flexible while maintaining the electrical and/or thermal contact between the separate components before, during, and after flexure.

It will be appreciated that many other uses for the conductive gaskets with fingers are possible. Such gaskets may provide an interface in a variety of devices for conducting electricity and/or heat.

The gasket 12 has many advantages relative to prior efforts to provide such interfaces. One prior approach has been to use conductive adhesives, such as conductive liquid/paste or film adhesives. Another approach has been to use conductive elastomeric gaskets. However conductive adhesives have shortcomings, in that the desire to maintain a very thin bond layer (for low electrical and thermal resistance) is at odds with the need to provide a thick bond layer improve the strain limit of the material, i.e. the compliance of the adhesive layer. Many adhesives are known to possess a high modulus of elasticity when cured, especially at temperatures above the adhesive's glass transition temperature. Compliance is important to compensate (i.e., strain without failure) for mismatches in the coefficient of thermal expansion (CTE) between the interfacing materials, and the strain due to CTE mismatch is especially acute over large interface areas over which the adhesive would be placed. In addition conductive adhesives require specialized equipment (such as pressing/clamping equipment, autoclaves, and/or vacuum bags) plus a significant investment in process development (such as to develop appropriate cure cycles and pressures).

Conductive elastomeric gaskets, such as those which are polymeric materials like silicone or fluorosilicone filled with conductive particles, possess limited electrical and thermal conductivity, and are generally used in thicknesses (such as a minimum of at least 0.5 mm (0.02 inches)) that are greater than is desired to maintain a low thermal resistance. In addition elastomeric gaskets may provide limited compression range, may require relative high compression force per unit area, and may compression-set leading to loss of electrical contact to interfacing surfaces over time.

Non-curing conductive pastes or gels are not suitable alternatives, since containment to particular areas of the interface cannot be assured, and pump-out (a phenomenon in which the material is forced out of the interface due to thermal excursions/cycles in which material expands and contracts) from the interface is a possibility. Furthermore it is desirable to be able to separate and then reconnect the components, which cannot be easily done with bonding (adhesive) materials or non-curing materials.

In contrast, gaskets such as the gasket 12 avoid or overcome many of these problems or shortcomings. The gasket 12 provides a robust electrical connection, for example providing a ground plane connection between a pair of components on opposite sides of the gasket 12. The fingers 34 (and the sheet 28) adjust to ensure contact in important areas, such as around the coaxial waveguide cavities in an electrically radiating structure.

The gasket 12 provides reasonably low thermal resistance, and has the advantage being pliable and conformable. The gasket 12 is well suited to easy assembly as a drop-in part that can be fitted with locating features in order to align it with the objects between which it is placed. No bonding, adhesion, or staking is required, which avoids costly, labor-intensive processes.

Depending on the implementation of the invention, only a low clamping force may be required, which means that there may be no need for specialized clamping features or tightly-spaced fasteners to hold objects (such as housing parts) together. The gasket 12 may also be utilized to improve the galvanic chain between mating (contacting) surfaces, for example with tin-lead alloy plating of the gasket 12 between gold and aluminum electrically-conductive surfaces of the objects 14 and 16 (FIG. 1) on opposite sides of the gasket 12. The gasket 12 allows easy separation and reconnection of the objects on either side—the gasket 12 may be reused and there is no need to add or replace any new material, such as paste, gel, or adhesive. Finally the gasket 12 may be produced at low cost and reliably, for example using a photo-etched or stamped thin sheet of material, with the fingers 34 perhaps bent using a suitable die or dies.

The gasket 12 may be formed using any of a variety of suitable other processes. Examples of alternatives to the processes listed above are laser cutting, water-jet cutting, and punching.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrically- and thermally-conductive interface gasket in combination with a pair of objects, the combination comprising:
   the electrically- and thermally-conductive interface gasket, which includes:
      a planar electrically-conductive flexible base; and
      a multitude of electrically-conductive fingers emerging out of the base; and
   the pair of objects;
   wherein the base and fingers are configured to make contact with and conform to surfaces of respective of the objects on opposite respective sides of the gasket;
   wherein the base and the fingers are configured to deform to conform to the surfaces of the objects; and
   wherein one of the objects includes cavities for radiative transmission of electromagnetic energy through openings in the base.

2. The combination of claim 1,
   wherein the fingers are located on peripheries of the openings.

3. The combination of claim 2, wherein the cavities are antenna element cavities, functioning as waveguides for antenna elements.

4. The combination of claim 1, wherein the base and the fingers are parts of a single piece of continuous unitary material.

5. The combination of claim 4, wherein the material is a sheet metal.

6. The combination of claim 5, wherein the sheet metal is coated, treated, or plated with another metal.

7. The combination of claim 5, wherein the sheet metal is plated with a soft metal material that is softer than the sheet metal material that the soft metal covers.

8. The combination of claim 7, wherein the soft metal material includes a material selected from the group consisting of a tin-lead alloy, tin, silver, and gold.

9. The combination of claim 1, wherein the base has a thickness of 0.0254 to 0.254 mm (0.001 to 0.010 inches).

10. The combination of claim 1, wherein the fingers include at least 100 fingers.

11. The combination of claim 1, wherein the fingers include at least 1000 fingers.

12. The combination of claim 1,
   wherein the fingers are located on peripheries of the openings; and
   wherein separation between adjacent of the fingers is one-third or less of a width of individual of the fingers.

13. The combination of claim 1,
   wherein the fingers are located on peripheries of the openings; and
   wherein the openings are rectangular or circular.

14. The combination of claim 1, wherein the base has a length and width at least 20 cm.

15. The combination of claim 1, wherein at least one of the objects includes a printed wiring board.

16. The combination of claim 1, wherein the gasket is not bonded, adhered, or staked to the objects, thereby being free to slide relative to the objects.

\* \* \* \* \*